United States Patent [19]
Yamamoto et al.

[11] Patent Number: 5,666,092
[45] Date of Patent: Sep. 9, 1997

[54] BANDPASS FILTER HAVING AT LEAST TWO SAW RESONATOR FILTERS COUPLED IN PARALLEL

[75] Inventors: Yasushi Yamamoto; Ryuuji Kajihara, both of Tokyo, Japan

[73] Assignee: NEC Corporation, Tokyo, Japan

[21] Appl. No.: 669,819

[22] Filed: Jun. 26, 1996

Related U.S. Application Data

[63] Continuation of Ser. No. 246,194, May 19, 1994, abandoned.

[30] Foreign Application Priority Data

May 19, 1993 [JP] Japan ................................. 5-139958

[51] Int. Cl.$^6$ ................................................ H03H 9/64
[52] U.S. Cl. ........................ 333/194; 333/195; 310/313 D
[58] Field of Search .................................. 333/193, 194, 333/195, 196; 310/313 R, 313 B, 313 C, 313 D

[56] References Cited

U.S. PATENT DOCUMENTS

| 4,178,571 | 12/1979 | Mitchell ................... 333/195 X |
| 5,296,824 | 3/1994 | Cho et al. ................... 333/193 |

FOREIGN PATENT DOCUMENTS

| 57-62616 | 4/1982 | Japan . |
| 5251986 | 9/1993 | Japan . |
| WO93/08641 | 4/1993 | WIPO ................... 333/193 |

Primary Examiner—Benny Lee
Assistant Examiner—Justin P. Bettendorf
Attorney, Agent, or Firm—Sughrue, Mion, Zinn, Macpeak & Seas

[57] ABSTRACT

In order to effectively increase a degree of freedom in designing a bandpass filter which includes at least two SAW resonator filters coupled in parallel and which have different bandpass center frequencies, the two SAW resonator filters have different frequency responses with each other.

10 Claims, 6 Drawing Sheets

BANDPASS FILTER HAVING AT LEAST TWO SAW RESONATOR FILTERS COUPLED IN PARALLEL

This is a Continuation of application Ser. No. 08/246,194 filed May 19, 1994 (now abandoned).

BACKGROUND OF THE INVENTION

1. Field of the Invention

The present invention relates generally to a bandpass filter including at least two surface acoustic wave (SAW) resonator filters coupled in parallel and utilizing longitudinal resonance modes, and more specifically to such a bandpass filter which features a high degree of design freedom.

2. Description of Related Art

It is well known in the art that SAW resonator filters have been widely used in telecomunication equipment wherein a narrow passband and low insertion loss are required.

Before turning to the present invention it is deemed preferable to discuss, with reference to FIGS. 1 and 2, a bandpass filter which appears important for an understanding of the present invention.

FIG. 1 schematically illustrates a conventional bandpass filter (depicted by numeral 4). This filter 4 consists of two saw resonator bandpass filters 6 and 8 which are electrically coupled in parallel. The SAW resonator filters 6 and 8, each using longitudinal resonance modes, are deposited on a piezoelectric substrate 10 in a wave propagation (viz., longitudinal) direction.

The SAW resonator filters 6 and 8 are configured in exactly the same manner except for the electrode widths thereof so that the pass band center frequencies of the two filters are different.

As shown in FIG. 1, the SAW resonator filter 6 includes two interdigital transducers (IDTs) 12a and 12b, and two grating reflectors 14a and 14b. On the other hand, the other SAW resonator filter 8 includes two IDTs 12a' and 12b', and two grating reflectors 14a' and 14b'.

An incoming signal is applied to the IDTs 12a and 12a' via an input terminal 16, while a filtered signal is obtained from an output terminal 18.

It should be noted that the filter characteristics of the two filters 6 and 8 are exactly identical with each other except for their passband center frequencies. As is well known in the art, the center frequencies are made different if the electrodes of the filter 6 are different from those of filter 8.

The frequency responses of the two SAW bandpass filters 6 and 8 are combined to obtain a passband which is wider than each of the SAW filters 6 and 8.

In FIG. 1, notations D1-D3 and D1'-D3' depict the distances between the elements of the SAW filters 6 and 8, as clearly shown in FIG. 1.

FIG. 2 is a sketch schematically showing frequency-loss characteristics of the bandpass filter 4 (denoted by a solid line 20). These filter characteristics can be obtained by combining those of the two filters 6 and 8 (denoted respectively by dashed lines 22 and 24).

It is understood that the low and high sides of the resultant bandpass (denoted by solid line 20) are determined by the corresponding low and high sides of the bandpass exhibited by the filters 6 and 8.

Accordingly, by way of example, if it is required that the resultant passband should have a sharp slope at the high side while maintaining at the relatively gradual slope the low side, it is not possible to meet such requirements with the above mentioned conventional circuit.

It is therefore highly desirable to expand or increase a degree of design freedom of such a type of composite bandpass filter.

SUMMARY OF THE INVENTION

It is an object of the present invention to provide a bandpass filter, consisting of at least two SAW resonator filters coupled in parallel, with a high degree of freedom in design thereof.

In brief, the object is fulfilled by a technique wherein in order to effectively increase a degree of freedom in designing a bandpass filter which includes at least two SAW resonator filters coupled in parallel and which have different bandpass center frequencies, the SAW resonator filters have frequency responses which are different with respect to each other.

BRIEF DESCRIPTION OF THE DRAWINGS

The features and advantages of the present invention will become more clearly appreciated from the following description taken in conjunction with the accompanying drawings in which like elements are denoted by like reference numerals and in which.

DETAILED DESCRIPTION OF THE PREFERRED EMBODIMENTS

One embodiment of the present invention will be discussed with reference to FIGS. 3, 4, 7, and 8.

Figure 3:
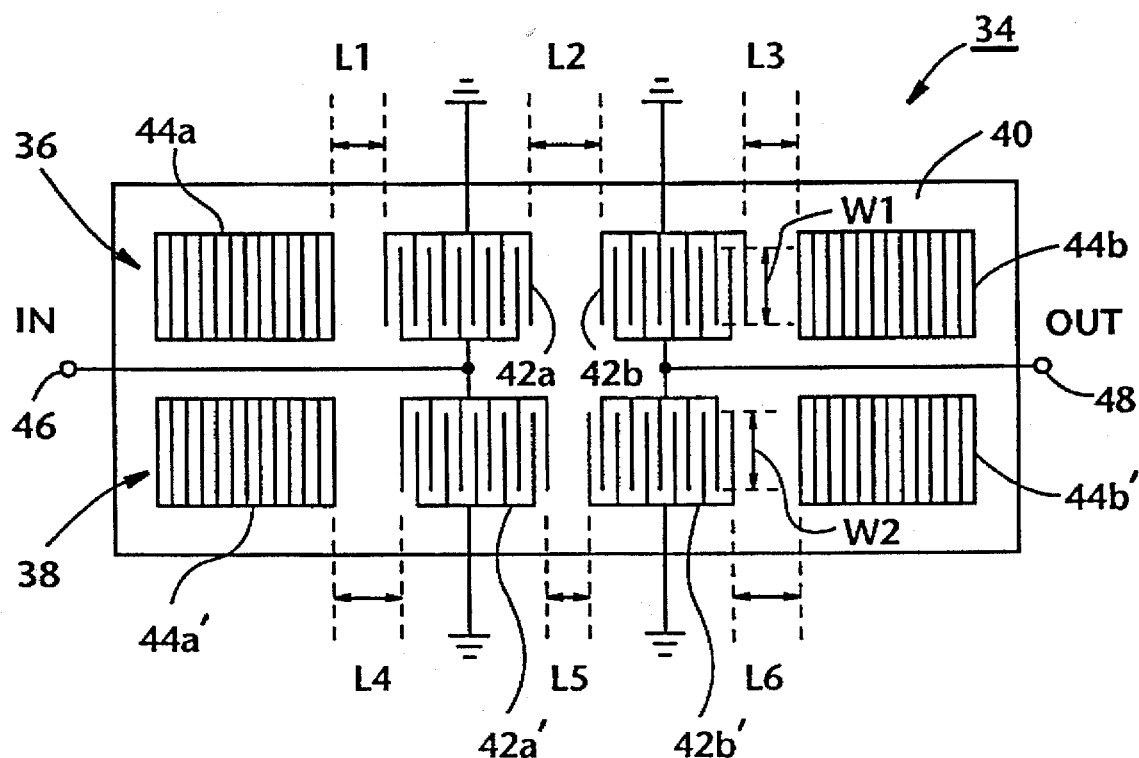
FIG. 3 is a diagram schematically showing one embodiment of the present invention.

FIG. 3 is a diagram schematically showing an arrangement of the embodiment. As in the conventional circuit shown in FIG. 1, a bandpass filter generally depicted by numeral 34 is comprised of two SAW resonator filters 36 and 38. The SAW resonator filter 36 includes an input and output IDTs 42a and 42b, two grafting reflectors 44a and 44b, all of which are arranged in an acoustic wave propagating direction (viz., a longitudinal direction). In the similar manner, the other SAW resonator filter 38 includes an input and output IDTs 42a' and 42b', two grating reflectors 44a' and 44b', all of which are arranged in the acoustic wave propagating direction as well.

According to the present invention, one or more parameters, which determine the frequency response of the bandpass filter, are chosen in order to obtain desired frequency-loss characteristics at either or both of the low and high sides of the filter's pass band.

The aforesaid parameters are distances L1, L2, L3, L4, L5, and L6 between the elements, as indicated in FIG. 3. That is to say, the distance L1 depicts the interval between the input IDT 42a and the reflector 44a, while the distance L6 defines the interval between the output IDT 42b' and the reflector 44b'. The other distances L2-L5 will not be describe din detail in that they will be readily appreciated when referring to FIG. 3.

Further, the frequency response of each of the SAW filters 36 and 38 can be changed or controlled by varying electrode overlap width depicted "W1" and "W2".

Figure 2:
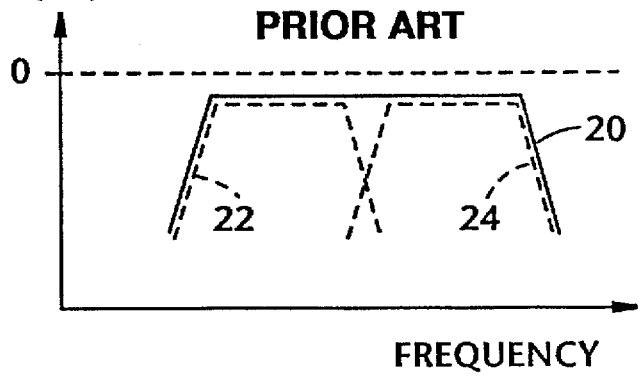
FIG. 2 is a sketch schematically showing frequency-loss characteristics of the filter shown in FIG. 1 together with those of the two SAW resonator filters.
Figure 4:
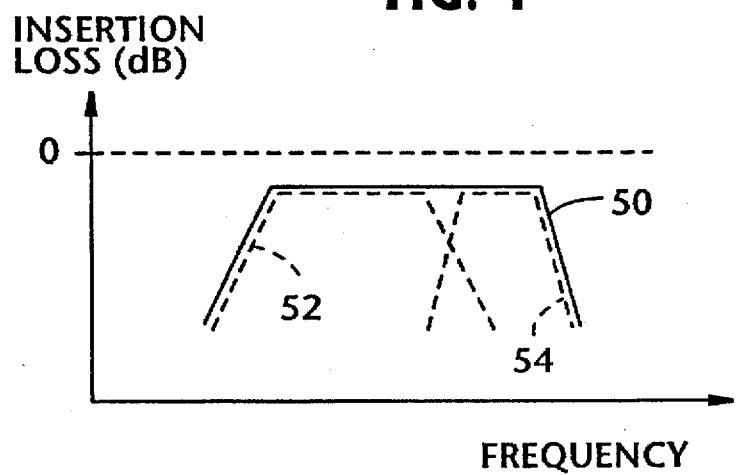
FIG. 4 is a sketch schematically showing frequency-loss characteristics of the bandpass filter shown in FIG. 3 together with those of two SAW resonators which form in combination the bandpass filter.

FIG. 4 shows one example of the resultant frequency-loss characteristics (indicated by a solid line 50) of the filter 34 of FIG. 3. More specifically, the SAW resonator filter 36 exhibits the frequency response (depicted by numeral 52) which is similar to the frequency response 22 shown in FIG. 2, while the other SAW resonator filter 38 has a frequency response (depicted by numeral 54) with a sharp slope at the high side of the pass band thereof.

Results obtained from the computer simulation conducted by the inventors are shown in FIGS. 5–8.

Figure 1:
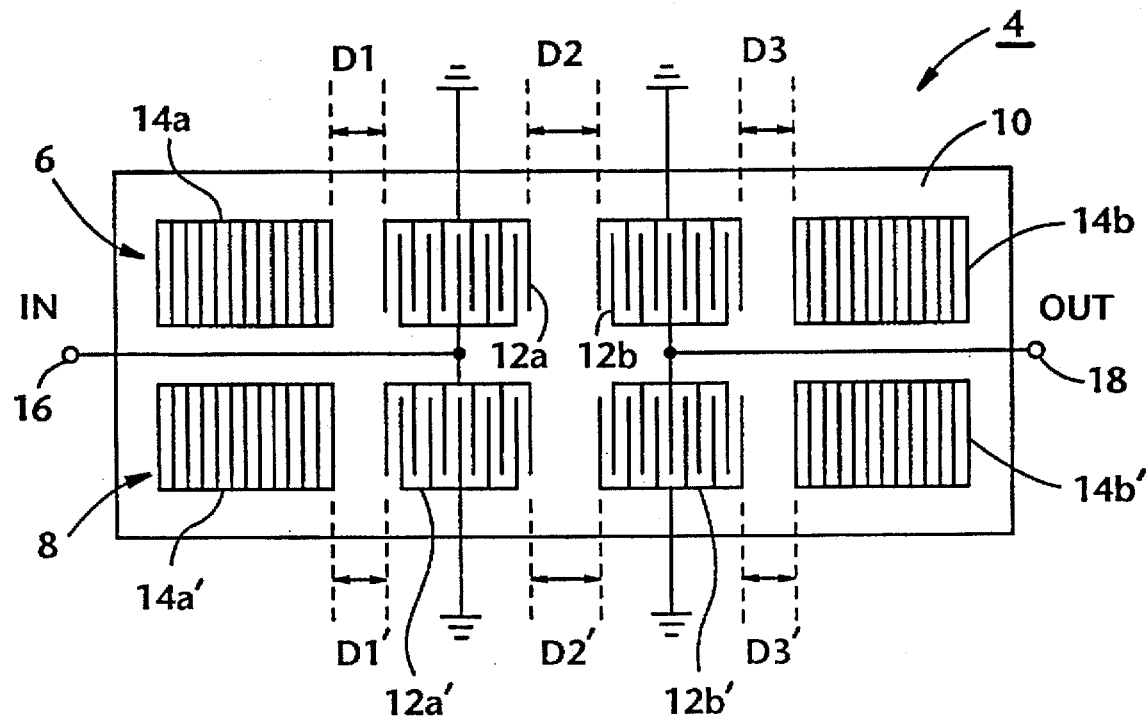
FIG. 1 is a diagram schematically showing a known arrangement of a bandpass filter consisting of two SAW resonator filters, having referred to in the opening paragraphs of the instant disclosure.
Figure 5:
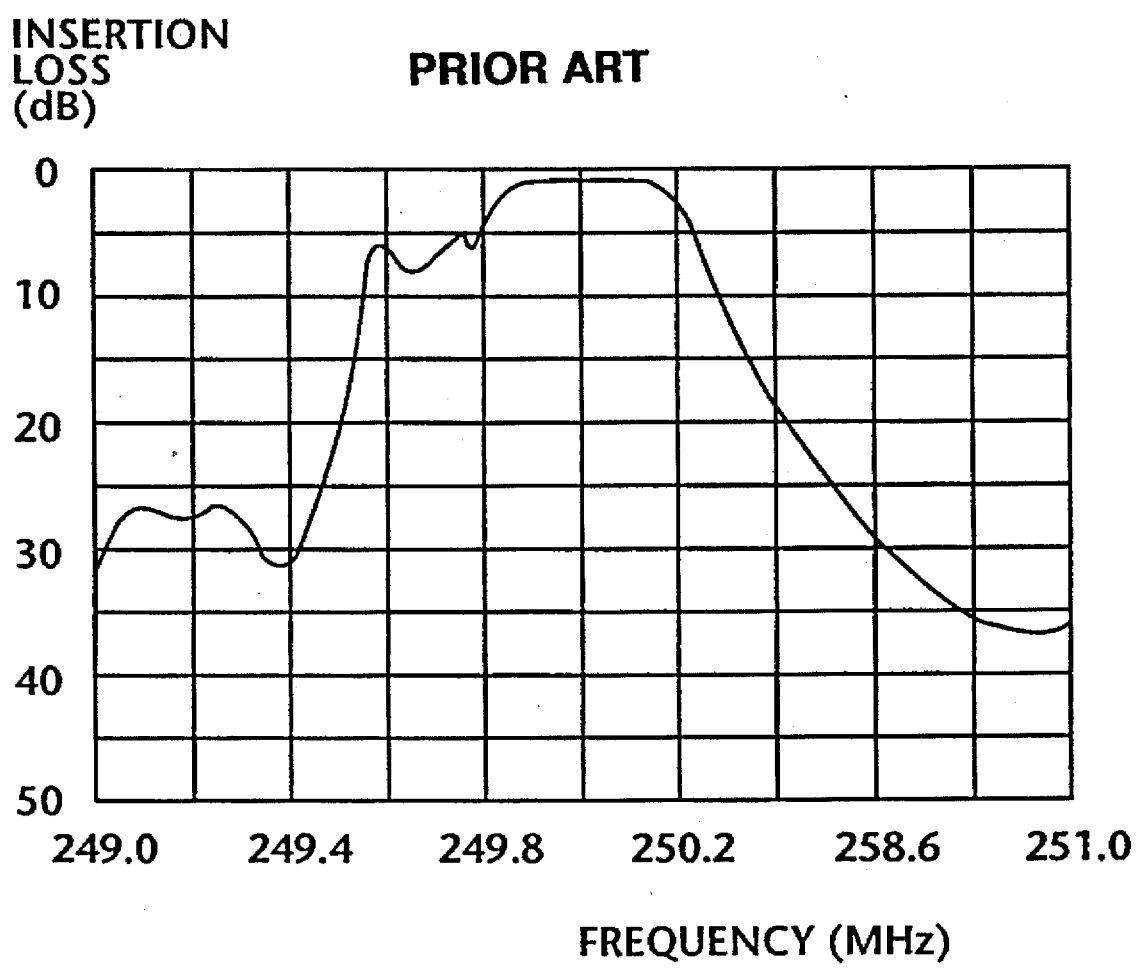
FIG. 5 illustrates frequency-loss characteristics derived from computer simulation conducted by the inventors in order to demonstrate the features of the conventional circuit.

FIG. 5 shows frequency-loss characteristics, measured from 249·0MHz to 251·0MHz, of the conventional bandpass filter shown in FIG. 1 under the following conditions:

(a) D1=D1'=0.58λ;
(b) D2=D2'=0.50λ;
(c) D3=D3'=14.00λ;
(d) The number of electrodes of each of the IDTs 12a-12a' and 12b-12b' is 340; and
(e) The number of electrodes of each of the reflectors 14a-14a' and 14b-14b' is 100.

In the above, λ is a wave length of a center frequency of the passband.

Figure 6:
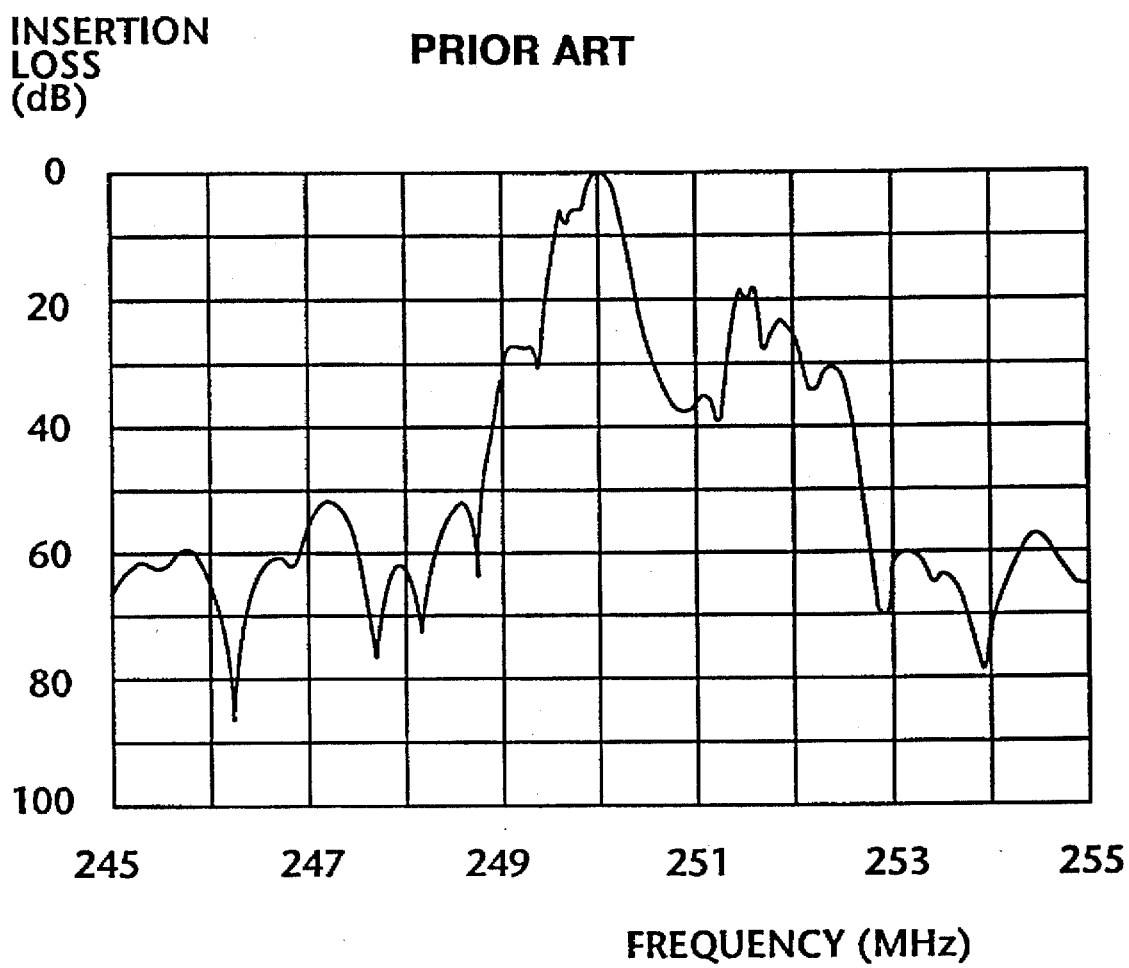
FIG. 6 illustrates frequency-loss characteristics derived from computer simulation conducted by the inventors in order to demonstrate features of the conventional circuit.

FIG. 6 shows frequency-loss characteristics, measured from 245 MHz to 255 MHz, of the conventional bandpass filter shown in FIG. 1 under the same conditions as indicated above.

Figure 7:
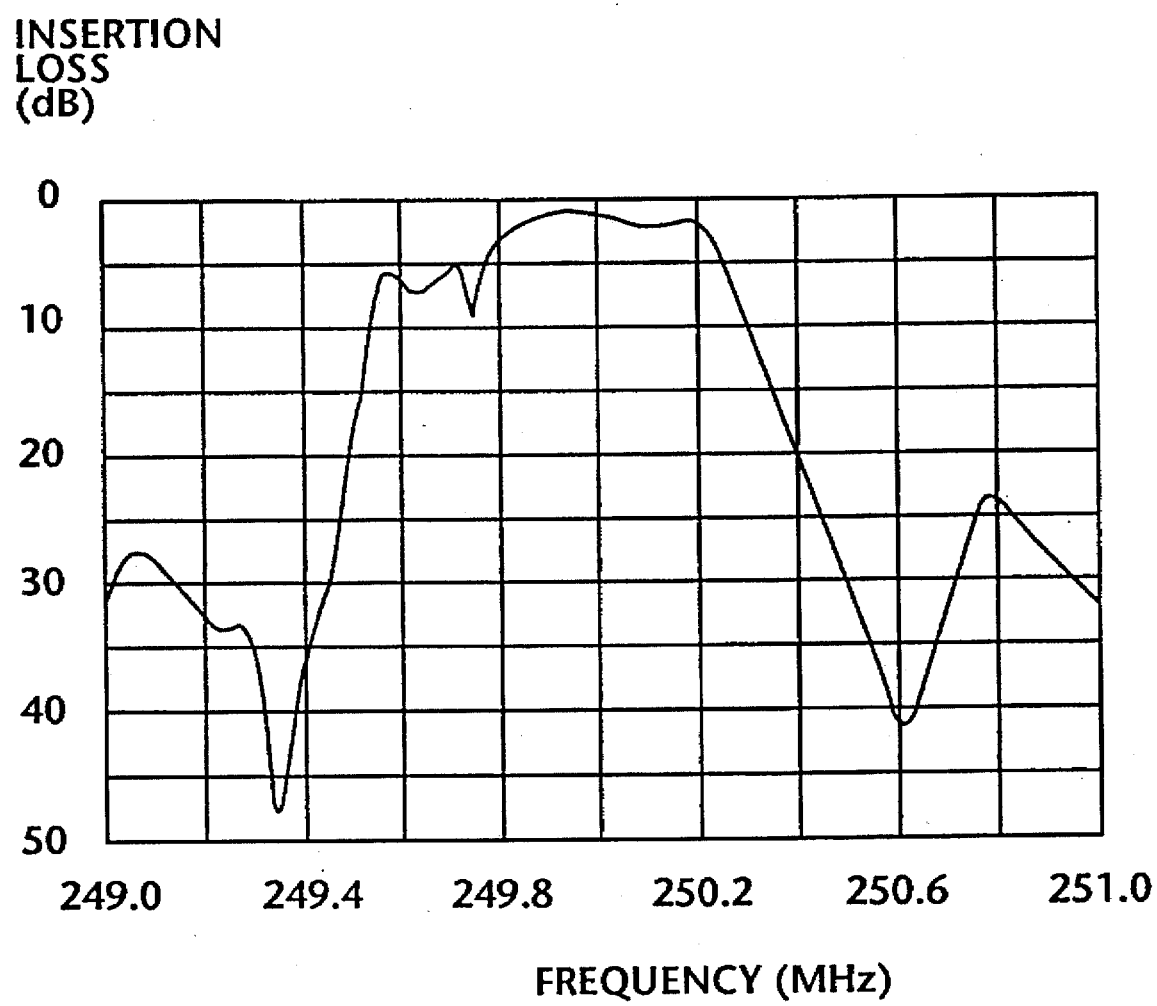
FIG. 7 illustrates frequency-loss characteristics derived from computer simulation conducted by the inventors in order to demonstrate features of the present invention.

FIG. 7 shows frequency-loss characteristics, measured from 249·0MHz to 251·0MHz, of the bandpass filter shown in FIG. 3 under the following conditions:

(a) L1=0.58λ;
(b) L2=0.55λ;
(c) L3=13.00λ;
(d) L4=0.73λ;
(e) L5=L2=0.55λ;
(f) L6=15.00λ;
(g) The number of electrodes of each of the IDTs 42a-42a' and 42b-42b' is 340; and
(e) The number of electrodes of each of the reflectors 44a-44a' and 44b-44b' is 100.

Figure 8:
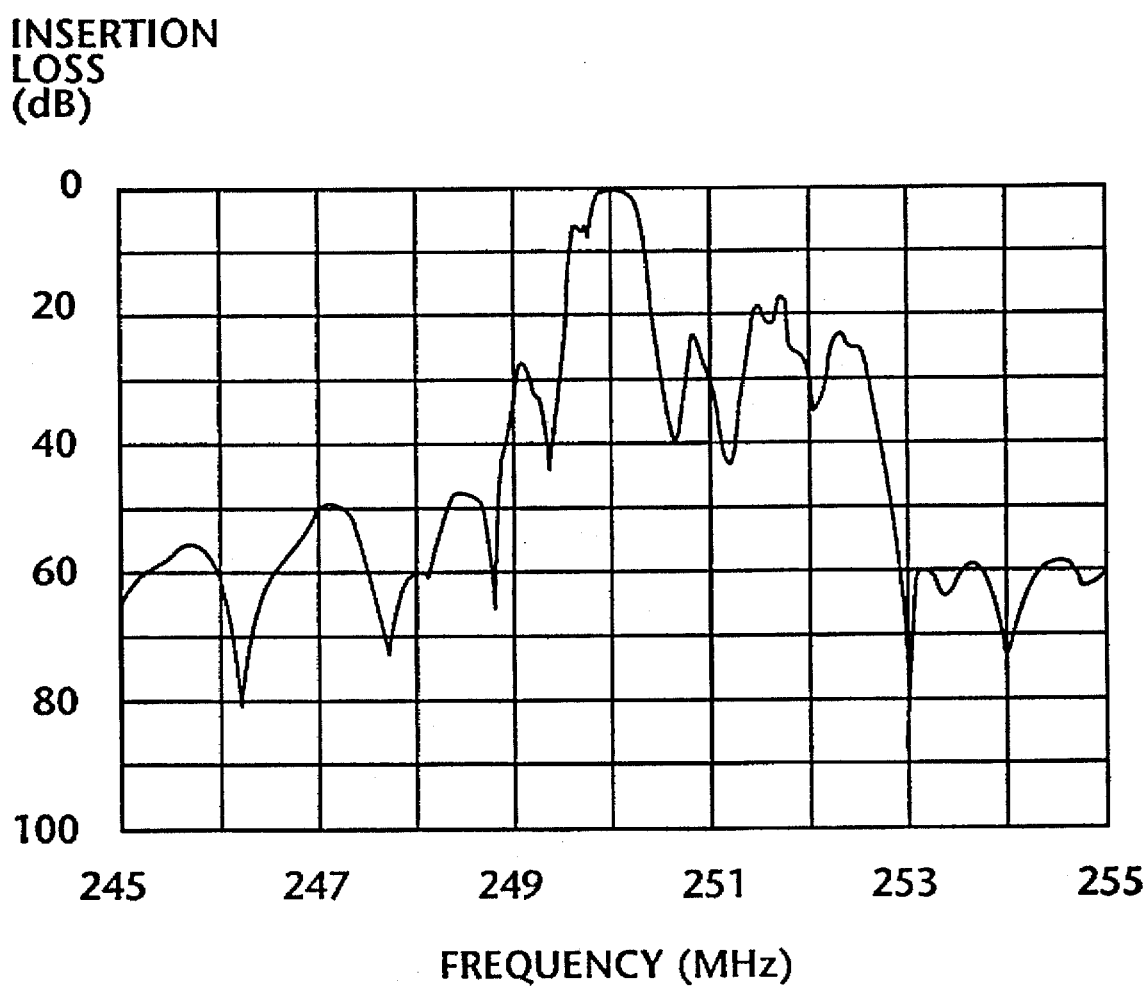
FIG. 8 illustrates frequency-loss characteristics derived from computer simulation conducted by the inventors in order to demonstrate features of the present invention.

FIG. 8 shows frequency-loss characteristics, measured from 245 MHz to 255 MHz, of the bandpass filter shown in FIG. 3 under the same conditions as indicated in connection with FIG. 7.

The above mentioned computer simulation indicates that the pass band of FIG. 7 has a sharp negative slope as compared with that of FIG. 5.

It will be understood that the above disclosure is representative of only one possible embodiments and that various modifications can be made without departing from the concept of the invention.

What is claimed is:

1. A bandpass filter comprising:

a first surface acoustic wave (SAW) resonator bandpass filter comprising first and second grating reflectors and first and second interdigital transducers (IDTs); and a second SAW resonator bandpass filter which is coupled in parallel to said first SAW resonator bandpass filter and comprises third and fourth grating reflectors and third and fourth IDTs, wherein:

a first distance between said first grating reflector and said first IDT is different from a third distance between said third grating reflector and said third IDT, and a second distance between said second grating reflector and said second IDT is different from a fourth distance between said fourth grating reflector and said fourth IDT, and at least one of the following conditions are met:

said first distance is different from said second distance; and said third distance is different from said fourth distance, said first through fourth distances setting frequency responses of said first and second SAW resonator bandpass filters to cause a waveform representing a pass band of said bandpass filter to have, at a high frequency end thereof, a slope whose value is different than a value of a slope of said passband at a low frequency end thereof.

2. A bandpass filter as claimed in claim 1, wherein said slope at said high frequency end is a substantially linear negative slope.

3. A bandpass filter as claimed in claim 1, wherein said first distance is different form said second distance, and said third distance is different form said fourth distance.

4. A bandpass filter comprising:

a first surface acoustic wave (SAW) resonator bandpass filter comprising a first plurality of interdigital transducers (IDT); and a second SAW resonator bandpass filter which is coupled in parallel to said first SAW resonator bandpass filter and comprises a second plurality of IDTs, wherein a distance between said first plurality of IDTs is different from a distance between said second plurality of IDTs so that frequency responses of said first and second SAW resonator bandpass filters are set to cause a waveform representing a passband of said bandpass filter to have, at a high frequency end thereof, a slope whose value is different than a value of a slope of said passband at a low frequency end thereof.

5. A bandpass filter as claimed in claim 3, wherein said distance between said first plurality of IDTs is greater than said distance between said second plurality of IDTs.

6. A bandpass filter as claimed in claim 4, wherein said first SAW resonator bandpass filter further comprises a first plurality of grating reflectors; and said second SAW resonator bandpass filter further comprises a second plurality of grating reflectors.

7. A bandpass filter as claimed in claim 6, wherein each of said IDTs comprises 340 electrodes.

8. A bandpass filter as claimed in claim 6, wherein each of said grating reflectors comprises 100 electrodes.

9. A bandpass filter comprising:

a first surface acoustic wave (SAW) resonator bandpass filter comprising first and second interdigital transducers (IDT) and first and second grating reflectors; and a second SAW resonator bandpass filter, which is coupled in parallel to said first SAW resonator bandpass filter, comprising third and fourth IDTs and third and fourth grating reflectors;

said first and second SAW resonator bandpass filters having different parameters which determine frequency responses of said first and second SAW resonator bandpass filters so that a waveform representing a passband of said bandpass filter has a sharp slope at a high frequency end thereof, wherein a distance between said first grating reflector and said first IDT is 0.58λ, a distance between said second grating reflector and said second IDT is 13.00λ, a distance between said third grating reflector and said third IDT is 0.73λ, and a distance between said fourth grating reflector and said fourth IDT is 15.00λ.

10. A bandpass filter as claimed in claim 9, wherein a distance between said first and second IDTs is 0.55λ and a distance between said third and fourth IDTs is 0.55λ.

* * * * *